United States Patent [19]

Sakai et al.

[11] Patent Number: 5,734,269
[45] Date of Patent: Mar. 31, 1998

[54] BRIDGE CIRCUIT FAULT MONITORING APPARATUS USING AN OUTPUT SIGNAL LEVEL FROM A BRIDGE CIRCUIT AND A POWER SOURCE CURRENT LEVEL TO DETERMINE FAULTS

[75] Inventors: Masayoshi Sakai; Toshihito Shirai, both of Saitama-ken; Hiroji Anzai, Tochigi-ken; Koichi Futsuhara, Saitama-ken, all of Japan

[73] Assignee: The Nippon Signal Co., Ltd., Tokyo, Japan

[21] Appl. No.: 624,507

[22] PCT Filed: Aug. 8, 1994

[86] PCT No.: PCT/JP94/01305

§ 371 Date: Apr. 5, 1996

§ 102(e) Date: Apr. 5, 1996

[87] PCT Pub. No.: WO96/05517

PCT Pub. Date: Feb. 22, 1996

[51] Int. Cl.$^6$ .............................. G01R 27/08; G01R 31/08
[52] U.S. Cl. .............................. 324/706; 324/526; 361/93
[58] Field of Search .............................. 324/522, 523, 324/525, 526, 527, 706, 725; 361/88, 93

[56] References Cited

U.S. PATENT DOCUMENTS

| 4,572,987 | 2/1986 | Embrey et al. | 315/77 |
| 4,661,880 | 4/1987 | Futsahara | 361/93 |
| 5,027,114 | 6/1991 | Kawashima et al. | 340/941 |
| 5,081,442 | 1/1992 | Ito et al. | 340/438 |
| 5,568,131 | 10/1996 | Sakai et al. | 340/648 |
| 5,619,110 | 4/1997 | Sugimoto et al. | 318/450 |

FOREIGN PATENT DOCUMENTS

| 62-115679 | 7/1987 | Japan . |
| 63-83664 | 6/1988 | Japan . |
| 3-77950 | 12/1991 | Japan . |
| 5-113446 | 7/1993 | Japan . |

Primary Examiner—Vinh P. Nguyen
Assistant Examiner—Diep Do
Attorney, Agent, or Firm—Finnegan, Henderson, Farabow, Garrett & Dunner, L.L.P.

[57] ABSTRACT

A bridge circuit monitoring apparatus which can accurately detect a fault in a bridge circuit of a sensor circuit even when multiple faults occur. Changes in the imbalance output signal of a bridge circuit (11) are monitored with a first window comparator (WC1), while changes in the bridge circuit (11) power source current, which does not require amplifying, are monitored with a second window comparator (WC2). At the time of an output of logic value "1" indicating that the monitoring outputs are both normal, an output of logic value "1" indicating that the bridge circuit (11) is normal is generated from an AND gate (13).

7 Claims, 12 Drawing Sheets

5,734,269

BRIDGE CIRCUIT FAULT MONITORING APPARATUS USING AN OUTPUT SIGNAL LEVEL FROM A BRIDGE CIRCUIT AND A POWER SOURCE CURRENT LEVEL TO DETERMINE FAULTS

TECHNICAL FIELD

The present invention relates to a bridge circuit fault monitoring apparatus, and in particular to fault monitoring technology which can accurately detect a bridge circuit fault in a sensor circuit utilizing a bridge circuit, even when multiple faults occur with the simultaneous malfunction of the bridge circuit and other constituent elements of the sensor.

BACKGROUND ART

Sensors which detect a change in an object of detection by detecting a change in an imbalance output signal of a bridge circuit which is provided on one side with a transducer for converting a change in the object of detection into a change in an electrical signal, are used in many types of measurement systems and the like. For this type of sensor, there is for example, the electromagnetic induction sensor which uses an electromagnetic induction coil for the transducer, the strain sensor which uses a strain gage for the transducer, or the temperature sensor which uses a temperature sensitive element (for example a thermistor or the like) for the transducer.

Fault modes of a bridge circuit incorporated in the sensor, are considered for the case where one side of the four sides has a disconnection fault so that the imbalance output signal increases, and for the case where a fault occurs in the power source input side of the bridge circuit and a disconnection fault occurs simultaneously in two of the four sides, so that the imbalance output signal becomes zero, and an output signal equivalent to the imbalance condition is produced.

As an example of a fail-safe sensor incorporating a bridge circuit fault monitoring function which takes into consideration such a fault mode in the bridge circuit, there is disclosed in U.S. Pat. No. 5,027,114, an electromagnetic induction sensor having an electromagnetic induction coil provided on one side of the bridge circuit, which detects a metallic movable body from an impedance change in the coil.

FIG. 1 illustrates the structural principle of the circuit of this sensor.

A bridge circuit 1 is made up of four sides with three resistors $R_1$, $R_2$, $R_3$, and a resonance circuit comprising a resistor R4, a capacitor C and a coil L, with an alternating current power source supplied from a signal generator SG. The resonance circuit may be a parallel resonance circuit. An imbalance output signal from the bridge circuit 1 is input to an amplifier A via a transformer T. The amplified output signal is then rectified by a rectifying circuit 2, and input to a fail-safe window comparator WC. Here the fail-safe window comparator WC is a known device such as disclosed in U.S. Pat. No. 4,661,880.

The fail-safe window comparator has a threshold value with upper and lower limits relative to an input level, such that when the input level is within a range (window) of the upper limit threshold value and the lower limit threshold value, an output voltage (corresponding to a logic value "1") is produced. On the other hand, when the input level is a higher level than the upper limit threshold value or when the input level is a lower level than the lower limit threshold value, an output voltage is not produced (corresponding to a logic value "0"). Furthermore, the construction is such that when a fault occurs in the window comparator itself, the output is always zero (logic value "0").

FIG. 2 illustrates the operating principle of the sensor circuit of FIG. 1.

In FIG. 2, the left hand graph shows changes in an imbalance output signal e of the bridge circuit 1. The vertical axis shows the imbalance output signal e (rectified output signal from the amplifier A) while the horizontal axis shows the magnitude of the inductance L of the coil or the magnitude of the electrostatic capacity C of the capacitor. With the imbalance output signal e, the valley point close to zero (the point where L=Lr, or C=Cr) is the balance point of the bridge circuit 1 (e≈0). The operating point for the bridge circuit 1 (e=es) is set to the position of inductance $L_S$. Furthermore, an inductance change $\Delta L_S$ (normally L>>$\Delta L_S$) of the coil is sampled as a change $\Delta e_S$ from the operating point $e_S$. The right hand graph in FIG. 2 shows the relation between the output from the bridge circuit 1, and the logical output signal Z from the window comparator WC.

Under normal-operation of this sensor circuit, the imbalance output signal e of the bridge circuit 1 is $e_S$, which is within the upper limit threshold value $V_H$ and the lower limit threshold value $V_L$ of the window comparator WC, and as shown by the graph in the right hand figure, the window comparator WC generates an output signal of logic value "1". On the other hand, when the inductance of the coil changes by $\Delta L_S$, the imbalance output signal e changes by $\Delta e_S$ from the operating point $e_S$ (that is to say e changes to e=$e_S$+$\Delta e_S$) and thus becomes higher than the upper limit threshold value $V_H$, so that the output signal from the window comparator WC changes to a logic value "0". Hence, by setting the operating point of the bridge circuit 1 to the imbalance point (e=$e_S$), instead of the balance point (e≈0), then fault monitoring of the bridge circuit 1 becomes possible.

That is to say, when the operating point of the bridge circuit 1 is set to the imbalance point (e=$e_S$), then when there is no power input to the bridge circuit 1, or when for example a disconnection fault occurs together in the resistors $R_1$, $R_3$, then the imbalance output signal e of the bridge circuit 1 changes from $e_S$ to e≈0, while when a disconnection fault occurs in one side of the bridge circuit 1, the imbalance output signal e changes to a much larger level than $e_S$. Thus, when a fault occurs in the bridge circuit 1, the imbalance output signal e of the bridge circuit 1 infallibly changes relative to the operating point $e_S$. Hence if the change values are set so as to fall outside of the range of the window of the window comparator WC, then a fault in the bridge circuit 1 can be detected from the change in the output signal from the window comparator WC.

However, when the normal operating point of the bridge circuit 1 is set to the balance point (e≈0), and a change in the inductance is sampled as a change in the imbalance output signal, then when power is not input to the bridge circuit 1, or when for example the resistors $R_1$, $R_3$ both have a disconnection fault, then there is no change in the imbalance output signal (in this condition for example, the imbalance output signal does not change even with a change in the inductance). Hence since the logic output signal of the window comparator does not change, then this type of fault in the bridge circuit 1 cannot be detected.

When the operating point is set to exclude the balance point (e≈0), then as is clear from the left hand graph of FIG. 2, there are two points, namely point $e_{S1}$ where the imbalance output increases relative to a positive change of $\Delta L_S$, and point $e_{S2}$ wherein the imbalance output decreases relative to a positive change of the $\Delta L_S$. However, with the side $e_{S2}$ wherein the imbalance output decreases relative to a positive change $\Delta L_S$, when the change of $\Delta L_S$ is large, the imbalance output signal e goes past the balance point (e≈0) and increases, so that the change appears smaller. Consequently, the side $e_{S1}$ where the imbalance output increases relative to a positive change of $\Delta L_S$, is normally set as the operating point.

With the sensor circuit of FIG. 1, in the case of a fault in the bridge circuit 1 when the other circuit structural elements are normal (in the case of a single fault), the fault in the bridge circuit 1 can be detected. However, the case wherein a fault occurs in the other circuit structural elements (for example the amplifier etc.) as well as in the bridge circuit 1 (the case of multiple faults), presents a problem in that it is not always possible to detect the fault in the bridge circuit 1.

Problems in the case of such multiple faults, are set forth below.

At first is a description of the theory concerning fault monitoring of a bridge circuit according to the configuration of FIG. 1.

FIG. 3 shows the basic circuit layout of the bridge circuit. Here $R_4$ denotes the resistance $R_4$, when the coil L and the capacitor C of the bridge circuit 1 of FIG. 1 are omitted (the circuit is equivalet to the resonance conditions at the time of the coil L and the capacitor C being short circuited). $R_s$ is the input resistance of the transformer T as seen from the bridge circuit 1 side.

Here an output $E_B$ (bridge circuit power source) of the signal generator SG is 1V, and the resistances $R_1$~$R_5$ are 1 KΩ respectively (this condition corresponds to the balance condition of FIG. 2). The values at this time for an output current $j_1$ (the imbalance current flowing in the resistor $R_5$) for the cases where; a disconnection fault occurs in the resistor Ri (i=1~4), a disconnection fault occurs in the resistor $R_5$, and disconnection faults occur in two of the resistors Ri (i=1~4), is shown in Table 1. The reason that only disconnection faults in the resistor side are considered is that faults of the resistor device are caused by burn out or breakage (short circuit faults normally do not occur).

TABLE 1

Output current at the time of a bridge circuit disconnection fault

| Fault condition | j1 (mA) |
| --- | --- |
| $R_i$ single fault | 0.13 |
| $R_5$ disconnection | 0 |
| $R_1$, $R_2$ disconnection | 0 |
| $R_1$, $R_3$ disconnection | 0 |
| $R_1$, $R_4$ disconnection | 0.33 |

In order for the output signal Z of the window comparator WC of FIG. 1 to become Z=0 when, from Table 1, the output current $j_i$ (imbalance current) changes by 0.13 mA due to a single fault of a resistor Ri (i=1~4), or by 0.33 mA due to a disconnection fault of resistors $R_1$, $R_4$, then the upper limit threshold value $V_H$ must be set to an imbalance current level smaller than the change of $j_i$=0.13 mA. Moreover at the time of, a disconnection fault in resistor $R_5$, a double fault in resistors $R_1$, $R_2$, or a double fault in resistors $R_1$, $R_3$ the output current becomes $j_i$=0. Hence in order to detect this fault condition, a lower limit threshold value $V_L$ of the window comparator WC becomes necessary.

The window comparator WC of FIG. 1 carries out two fault monitoring operations. One is fault monitoring of the abovementioned bridge circuit, while the other is fault monitoring of the amplifier A. Therefore the setting of the output signal $e=e_S$ of the imbalance condition of the bridge circuit as the operating point, means the two monitoring conditions, namely the condition wherein the bridge circuit faults so that the output current ji becomes $j_i$=0 and $j_i$>0.13, and the condition wherein the amplifier A faults so that the output signal $e=e_S$ is not generated.

The characteristics of the amplifier A will now be considered.

The amplifier A should not generate an operating point voltage $e=e_S$ (more precisely, within the threshold value of the upper and lower limits of the window comparator WC) with a fault. Otherwise there is the possibility of the output signal becoming $e=e_S$ with a fault of the amplifier A, even if for example a fault of Table 1 of $j_1$=0 is produced in the bridge circuit. It is not permitted to have self oscillation in the amplifier A such that an output is produced within the threshold value range of the upper and lower limits of the window comparator WC. If the output signal e has a magnitude which exceeds the upper limit threshold value $V_H$ of the window comparator WC, even with self oscillation in the amplifier A, then the logical output signal Z from the window comparator WC becomes Z=0. When an operational amplifier is used in the amplifier A, then the case wherein self oscillation occurs with a fault of the amplifier must be assumed. When the operational amplifier deteriorates in the oscillation condition (this consideration is necessary since the operational amplifier uses a large number of amplifying circuits to obtain a high gain), and by chance the frequency of the self oscillation becomes high, but the amplitude of the output is not increased so that an output signal e of a level within the threshold value of the upper and lower limits of the window comparator WC is produced, then a single fault of the operational amplifier cannot be detected by the window comparator WC. Therefore the simple use of an operational amplifier in the amplifier A is not really recommended. With the sensor circuit of the beforementioned U.S. Pat. No. 5,027,114, this situation has not been considered.

FIG. 4 shows a basic circuit example of the sensor circuit shown in the block diagram of FIG. 1, with the fail-safe window comparator removed. Moreover, an amplifier $A_0$ is inserted between the signal generator SG and the bridge circuit 1, and an alternating current power source is supplied to the bridge circuit 1 by way of a transformer $T_1$. A capacitor Cf of the rectifying circuit 2 is a four terminal capacitor, such that if a disconnection fault occurs in the terminals of the capacitor, an output signal e is not produced.

FIG. 5 shows an example of the change in input/output characteristics when a fault occurs in the amplifier A of FIG. 4.

In FIG. 5, the horizontal axis is the input signal $e_a$ (peak to peak value) while the vertical axis is the output signal e (level of the direct current output value from the rectifying circuit 2). The point $e_0$ (corresponding to the inductance $L_S$) on the input signal $e_a$ horizontal axis, is the set operating point $e_S$. The curve (a) shows the case wherein the amplifier A is in a normal operating condition, while the other curves $f_1$~$f_4$ show the case wherein the amplifier A is faulty. Furthermore in FIG. 5, for example $Q_3$: short between CB (the curve $f_2$ case), has the meaning as shown in FIG. 6, of a short between the collector and base of the transistor $Q_3$, being the condition wherein a current $i_{CB}=i_1+i_2+i_3$ flows continuously in the transistor $Q_3$. In FIG. 5, a fault wherein due to a fault in the amplifier A of FIG. 4 the input and output are isolated (for example a disconnection fault in the base of the transistor $Q_2$ or the transistor $Q_3$, or a disconnection fault of the transformer $T_2$ or the collector of the transistor $Q_3$) is not shown. The reason for this is that with this type of fault, it is clear that the output signal e is not output (e=0).

The input characteristics of FIG. 5 are for the case where, in the circuit of FIG. 4, the resistors $R_1$, $R_2$, $R_3$, $R_7$ and $R_9$ are 1 KΩ, the resistor R8 is 3.4 KΩ, the resisters $R_{10}$, $R_{50}$ are 100Ω, and the resistor $R_{11}$ is 51Ω, and the power source input to the bridge circuit 1 (the output voltage from the transformer T1) is 30 $V_{p-p}$.

From the input characteristics of FIG. 5 it can be seen that if a fault occurs in the amplifier A in FIG. 4, there is always a significant drop in the gain. Furthermore, if an amplifier A is used wherein, as with the amplifier A shown in FIG. 4, the output e always drops at the time of a fault, then when the bridge circuit 1, and its power source input, are operating normally (when the output e is within the upper and lower threshold values $V_H$, $V_L$ of the window comparator WC), if a fault occurs in the amplifier A, the level of the output signal e drops. It is thus possible to detect a single fault of the amplifier A with the window comparator WC.

However, if a fault occurs in the bridge circuit 1, so that the input level $e_a$ of the amplifier A increases, and moreover the amplifier A faults so that the gain drops, then if the threshold $V_L$ of the lower limit is too low, then for example with the curves $f_1$, $f_2$, $f_3$ there is the likelihood of a logic value "1" being produced for the output signal Z of the window comparator WC.

FIG. 7 shows the input and output characteristics for the case wherein multiple faults occur in the amplifier A.

In FIG. 7, curve (a) shows the normal situation, curve $f_5$ shows the case wherein there is an overlap of short circuit fault between the CB of the transistor $Q_2$ and a disconnection fault of the resistors $R_9$, $R_{10}$, curve $f_6$ illustrates the case wherein there is an overlap of a short circuit fault between the CB of the transistor $Q_2$ and a disconnection fault of the resistors $R_8$, $R_{10}$, and curve $f_7$ illustrates the case wherein there is an overlap of a short circuit fault between the CB of the transistor $Q_2$ and a disconnection fault of the resistor $R_{10}$.

When multiple faults occur simultaneously, then it can be seen that compared to the case of a single fault shown in FIG. 5, a voltage within the threshold range of the upper and lower limits of the window comparator WC is produced by an input signal $e_a$ of a much lower level.

Consequently, with the fault monitoring arrangement for the bridge circuit in the sensor circuit shown in FIG. 1, when there is a single fault in the constituent elements of the circuit, sufficient fault monitoring function can be realized. However, in the case of multiple faults where several faults occurs simultaneously, such as a fault in the bridge circuit 1 resulting in an increase in the imbalance output and a simultaneous fault in the amplifier A resulting in a drop in the gain, then it is assumed that the logical value output signal Z of the window comparator WC may show a logic value "1". Hence it does not necessarily follow that a fault in the bridge circuit 1 can be detected.

Therefore, for the fault monitoring method of the bridge circuit 1, a method has been considered where the occurrence of a change such that the imbalance output signal is significantly increased, is directly detected. FIG. 8 shows a circuit example for this method.

With this circuit example, the construction is such that a third winding $N_3$ is provided in the transformer T in addition to the primary winding $N_1$ and the secondary winding $N_2$, and a light emitting element $D_5$ is connected to the output side of the third winding $N_3$ via a current reducing resistor $R_0$. $D_6$ is a diode for protecting the light emitting element $D_5$.

In FIG. 8, if the output voltage of the transformer $T_1$ on the input side of the bridge circuit 1 is 30 $V_{p-p}$, then when a disconnection fault occurs for example in the resistors $R_1$, $R_4$, a relatively large voltage can be applied to the primary winding $N_1$ of the transformer T. If this voltage is sampled by the third winding $N_3$, then such a fault of the bridge circuit 1 can be easily detected. However with this method, in a worst case scenario where a disconnection fault occurs in the third winding $N_3$, the fault cannot be detected. Furthermore if as shown in FIG. 8, the arrangement is such that when a fault occurs, the light emitting element $D_5$ comes on to give a warning, then in the case of a disconnection in the current reducing resistor $R_0$, or a fault in the light emitting element $D_5$, it becomes impossible to give a warning.

More specifically, in monitoring faults in the bridge circuit, the fact that the bridge circuit is normal is monitored and the result of the monitoring continuously output. Hence when a fault occurs in the bridge circuit, the arrangement must be such that this continuous output is extinguished. This is the first condition for monitoring a fault of the bridge circuit. Hence, when a circuit used for monitoring has a fault, the output showing the monitoring results is extinguished (fail-safe construction), so that a signal showing that conditions are not normal (logic value "0") can be produced, even if a fault occurs in the bridge circuit, or in the circuit used for monitoring.

The sensor circuit of FIG. 1 is a system configuration for satisfying the abovementioned first condition. However, if multiple faults are considered where for example the bridge circuit and the amplifier circuit both fault at the same time, then as is clear from FIG. 5, and FIG. 7, with the sensor circuit of FIG. 1, the abovementioned first condition is no longer satisfied. The reason for this is due to the fact that with a fault in the amplifier A it is not possible to avoid a drop in gain. Consequently, in the fault monitoring of the bridge circuit, it is not permissible to incorporate an amplifier circuit. This is the second condition for monitoring a fault in the bridge circuit.

Here when the configuration of the sensor circuit of FIG. 1 is again analyzed, the system of FIG. 1 can be configured so as to have the following three functions.

(1) A small change $\Delta L_S$ occurring in the coil L is sampled, and when this change $\Delta L_S$ occurs, the output signal is made Z=0.

(2) When a fault occurs in the bridge circuit, the output signal is made Z=0.

(3) When a fault occurs in the amplifier A, the output signal is made Z=0.

Here the amplifier A is an essential element for amplifying the small change $\Delta L_S$ in the signal.

Furthermore, with the system structure of FIG. 1, if the above phenomena (2) and (3) occur independently, then the fault monitoring objective is achieved. However if the above phenomena (2), and (3) occur overlapped, then the fault monitoring objective is not always achieved (even if the amplifier A has a fail-safe construction, this is not always achieved).

That is to say, with the construction of the sensor circuit of FIG. 1, a single fault of a circuit element can be detected. However, at the time of multiple faults such as a fault in the bridge circuit and the amplifier occurring at the same time, there is the problem in that the situation can arise wherein fault detection of the bridge circuit cannot be carried out.

Table 2 shows the change in the signal power source current j2 (bridge circuit power source current) for the basic construction of the bridge circuit shown in FIG. 3, for the case where a disconnection fault occurs in the circuit structural elements. Percentage change is shown in brackets.

TABLE 2

Power source current at the time of a bridge circuit disconnection fault

| Fault condition | j2 (mA) |
| --- | --- |
| Ri single fault | 0.6 (−40%) |
| R5 disconnection | 1 |
| $R_1$, $R_2$ disconnection | 0.5 (−50%) |
| $R_1$, $R_3$ disconnection | 0 |
| $R_1$, $R_4$ disconnection | 0.33 (−67%) |

With the circuit structure of FIG. 3, the bridge circuit is balanced beforehand (Ri=1KΩ, i=1~5). At this time, $j_2$=1 mA.

If a disconnection fault occurs in the resistor $R_5$ only, the current $j_2$ does not change. However, if a disconnection fault occurs in any one of resistors Ri (i=1~4), or simultaneously in a plurality of resistors Ri, then it will be apparent that the current $j_2$ changes by 40% or more. Here in Table 2, the operating point $e_S$ has not been considered as the imbalance condition. This is because changes due to a change in the operating point $e_S$ can be disregarded, since changes due to a fault in the respective sides of the bridge circuit are much greater than a deviation in the resistance (impedance) of one side which gives to the operating point $e_S$.

The greatest difference between the output current $j_1$ in Table 1 and the power source current $j_2$ in Table 2, is that; with the output current $j_1$, in order to sample a small imbalance output signal change corresponding to the change $\Delta L_S$, then a small current is treated (in general, the smaller the inductance change $\Delta L_S$ to be sampled the smaller the $j_1$). Consequently, the amplifier A requires a large amplifying level. On the other hand, with the power source current $j_2$, since when the bridge circuit is normal this already has a large current, there is no need for much amplification.

The present invention takes into consideration the above situation with the object of being able to reliably detect a fault in the bridge circuit, even in the case wherein multiple faults occur in the structural elements of the circuit, by monitoring the bridge circuit power source current (which does not require amplification), to thereby carrying out fault detection of the bridge circuit.

DISCLOSURE OF THE INVENTION

Accordingly with the present invention there is provided a bridge circuit fault monitoring apparatus for monitoring faults in a bridge circuit of a sensor circuit comprising; the bridge circuit for sampling a change in a detection object as a change in an imbalance output signal, a power supply device for supplying an alternating current power source current to the bridge circuit, and an amplifier for amplifying an imbalance output signal from the bridge circuit, wherein an amplified output signal from the amplifier is made a detection output for the change in the detection object, the bridge circuit fault monitoring apparatus incorporating; a fail-safe first judgment device for judging whether or not the amplified output signal level of the amplifier is normal, which generates an output of logic value "1" when normal, and an output of logic value "0" when not normal, and which gives an output of logic value "0" at the time of a fault, a fail-safe second judgment device for judging whether or not the power source current level supplied to the bridge circuit is normal, which generates an output of logic value "1" when normal and an output of logic value "0" when not normal, and which gives an output of logic value "0" at the time of a fault, and a fail-safe logical product operating device which generates an output of logic value "1" indicating that the bridge circuit is normal when the outputs from the first judgment device and the second judgment device are both of logic value "1", and which gives an output of logic value "0" at the time of a fault.

With such an arrangement, even in the event of a multiple fault with the bridge circuit and the amplifier circuit faulting together, then even if for example the output from the first judgment device shows normal as a result of an increase in an imbalance output signal due to a fault in the bridge circuit being off set by a gain drop due to a fault in the amplifier, the fault can be detected by the second judgment device from a change in the power source current of the bridge circuit. Furthermore, since the power source current of the bridge circuit is much larger than the imbalance output of the bridge circuit, then fault detection outputs based on changes in the power source current can be sampled without using the amplifier. Hence problems due to the abovementioned multiple fault do not arise with respect to the judgment results of the second judgment device.

Moreover, if for the amplifier a device constructed such that the gain drops at the time of a fault is used, then with the first judgment device, a single fault of the amplifier can be reliably detected.

The first judgment device may basically be a fail-safe first window comparator having an upper limit threshold value and a lower limit threshold value, which respectively generates an output of logic value "1" when the amplified output signal level of the amplifier is within a range of the upper limit and lower limit threshold values, and an output of logic value "0" when outside of the range of the upper and lower limit threshold values, and which gives an output of logic value "0" at the time of a fault.

Furthermore, the second judgment device may comprise; a power source current detection device for detecting an alternating current power source current supplied from the power supply device to the bridge circuit, a rectifying circuit for rectifying an alternating current output signal corresponding to the power source current output from the power source current detection device, and a fail-safe second window comparator having an upper limit threshold value and a lower limit threshold value, which respectively generates an output of logic value "1" when the rectified output signal level of the rectifying circuit is within a range of the upper and lower limit threshold values, and an output of logic value "0" when outside of the range of the upper limit and lower limit threshold values, and which gives an output of logic value "0" at the time of a fault.

Moreover, if the power source current detection device is so constructed that a winding for detecting the power source current is provided in a transformer in an amplifier of the power supply device, then it is not necessary to provide for example a new separate transformer for power source current detection.

Furthermore, the construction may be such that in the case wherein the bridge circuit is provided on one side with an electromagnetic inductance coil serving as a transducer for converting a change in the detection object into an electrical signal, and a capacitor and a resistor constituting a resonance circuit with the electromagnetic inductance coil, and the electromagnetic inductance coil is connected to the one side via an external wiring terminal, then the resistor is divided in two with the external wiring terminal therebetween.

In this way, even if a short circuit fault occurs between the external wiring terminals with the electromagnetic inductance coil and the capacitor under resonance conditions, since the resistance value of one side of the bridge circuit changes, then a change occurs in the power source current so that the fault in the bridge circuit can be detected.

BEST MODE FOR CARRYING OUT THE INVENTION

As follows is a description of embodiments of the present invention with reference to the drawings.

Figure 4:
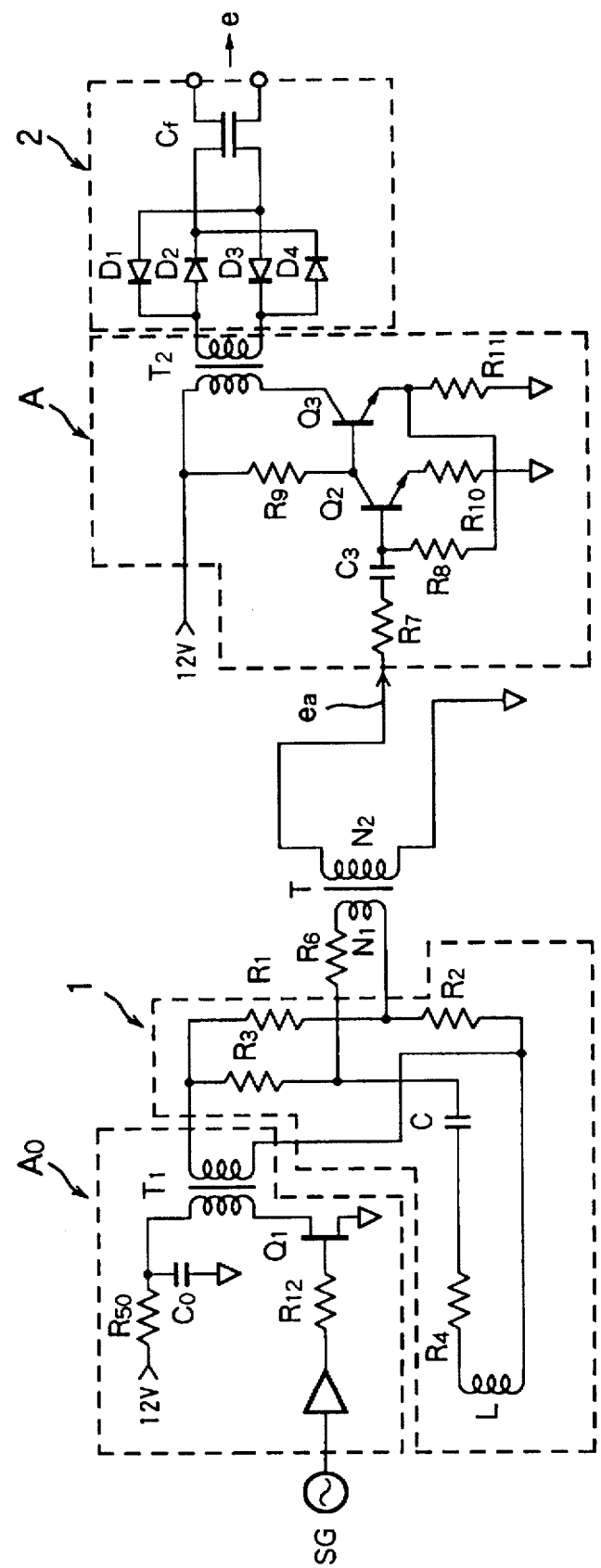
FIG. 4 is a basic circuit diagram of the electromagnetic inductance sensor of FIG. 1.
Figure 5:
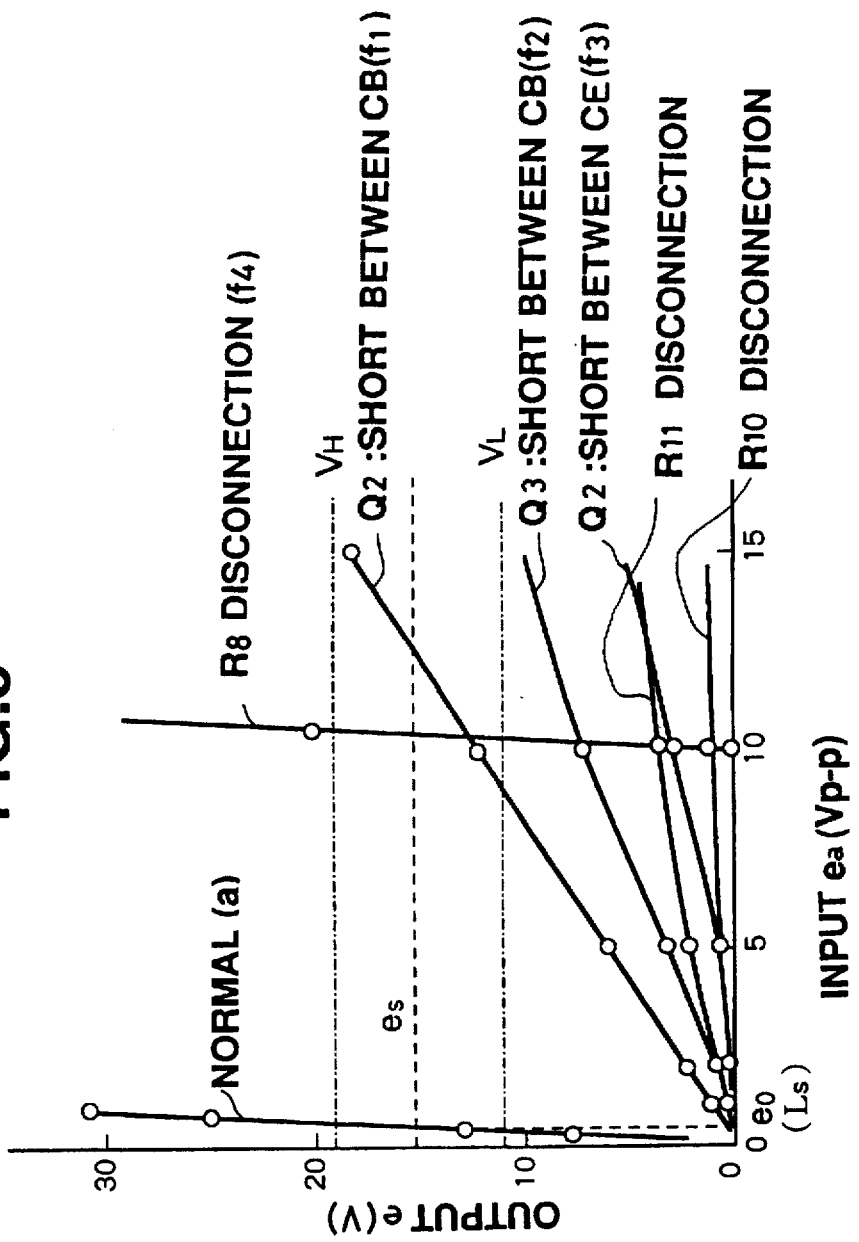
FIG. 5 is a diagram showing input/output characteristics at the time of a single fault in the amplifier of FIG. 4.
Figure 6:
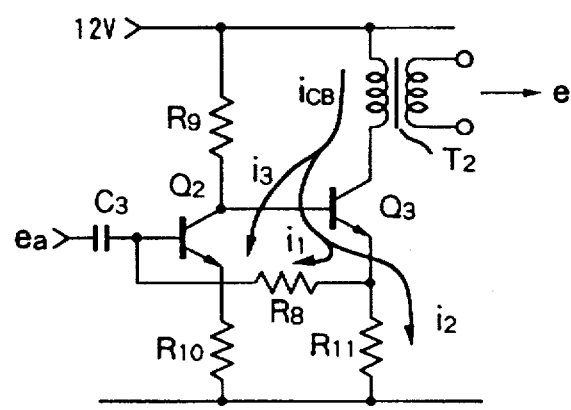
FIG. 6 is a diagram for explaining a fault example in the amplifier of FIG. 4.
Figure 7:
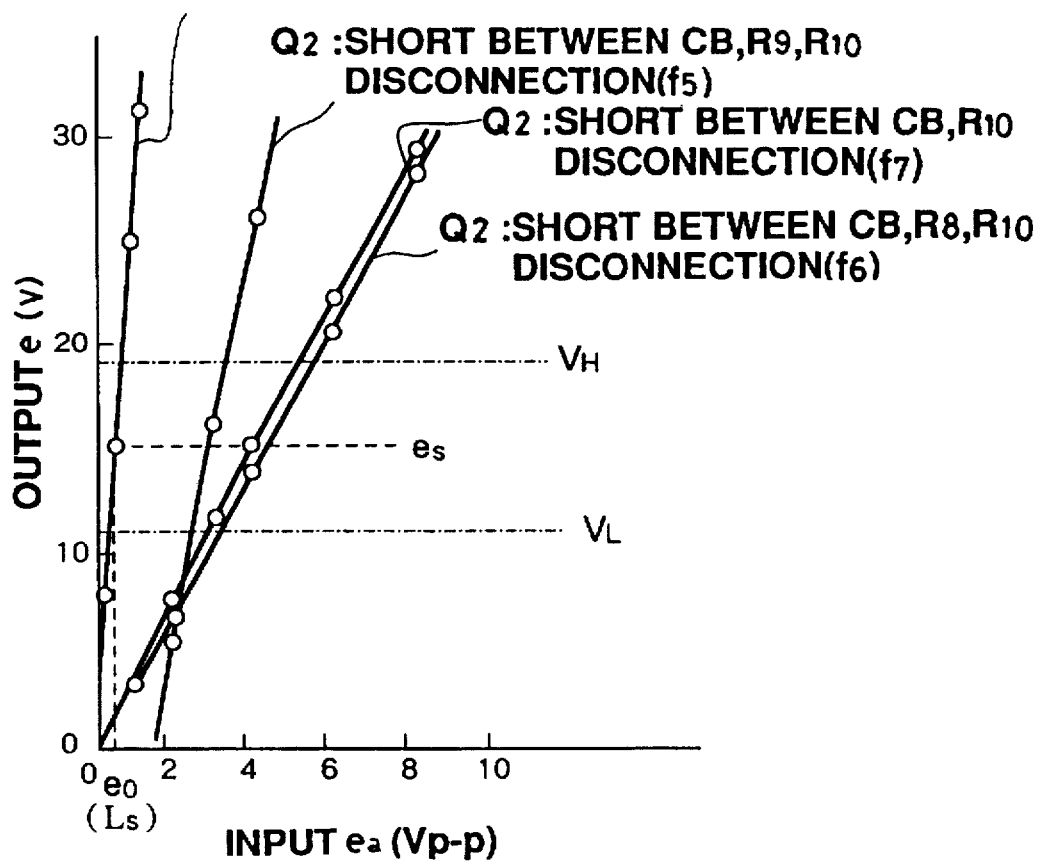
FIG. 7 is a diagram showing input/output characteristics at the time of multiple faults in the amplifier of FIG. 4.
Figure 8:
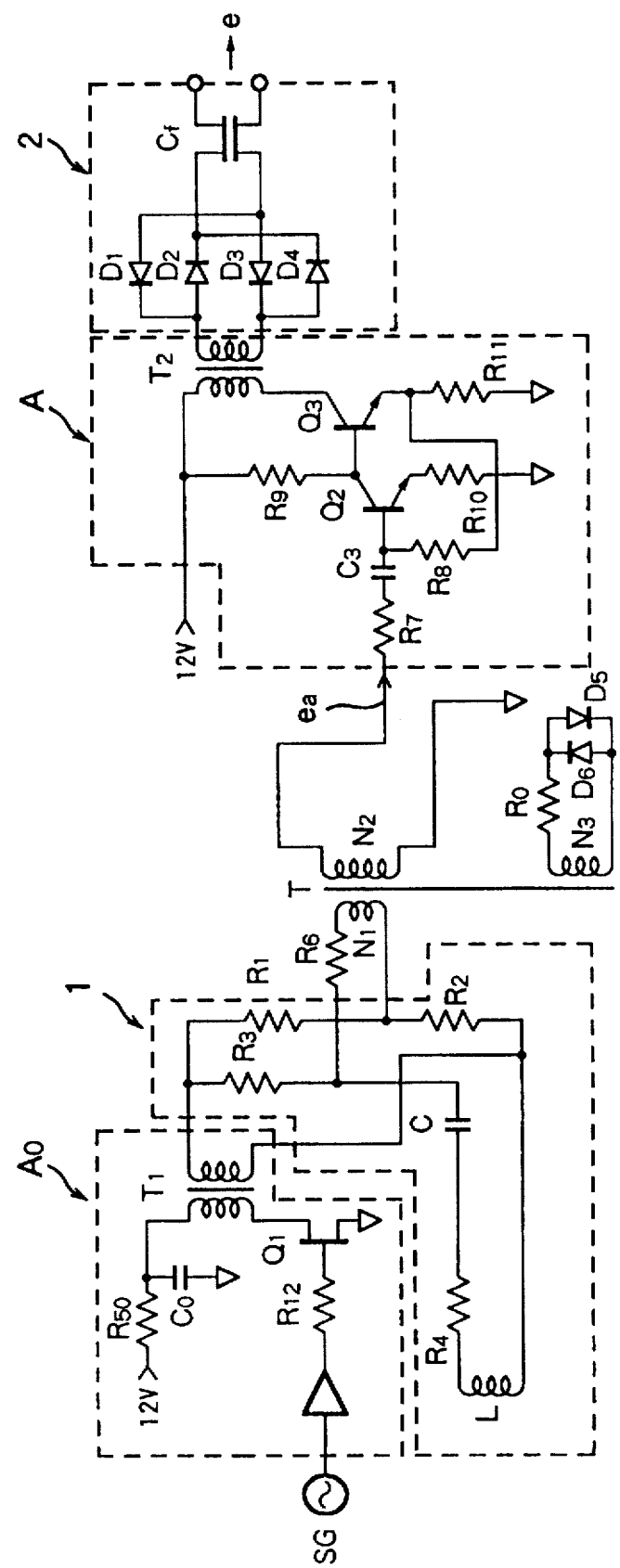
FIG. 8 is a circuit example for the case wherein the output current change of the bridge circuit is monitored.
Figure 9:
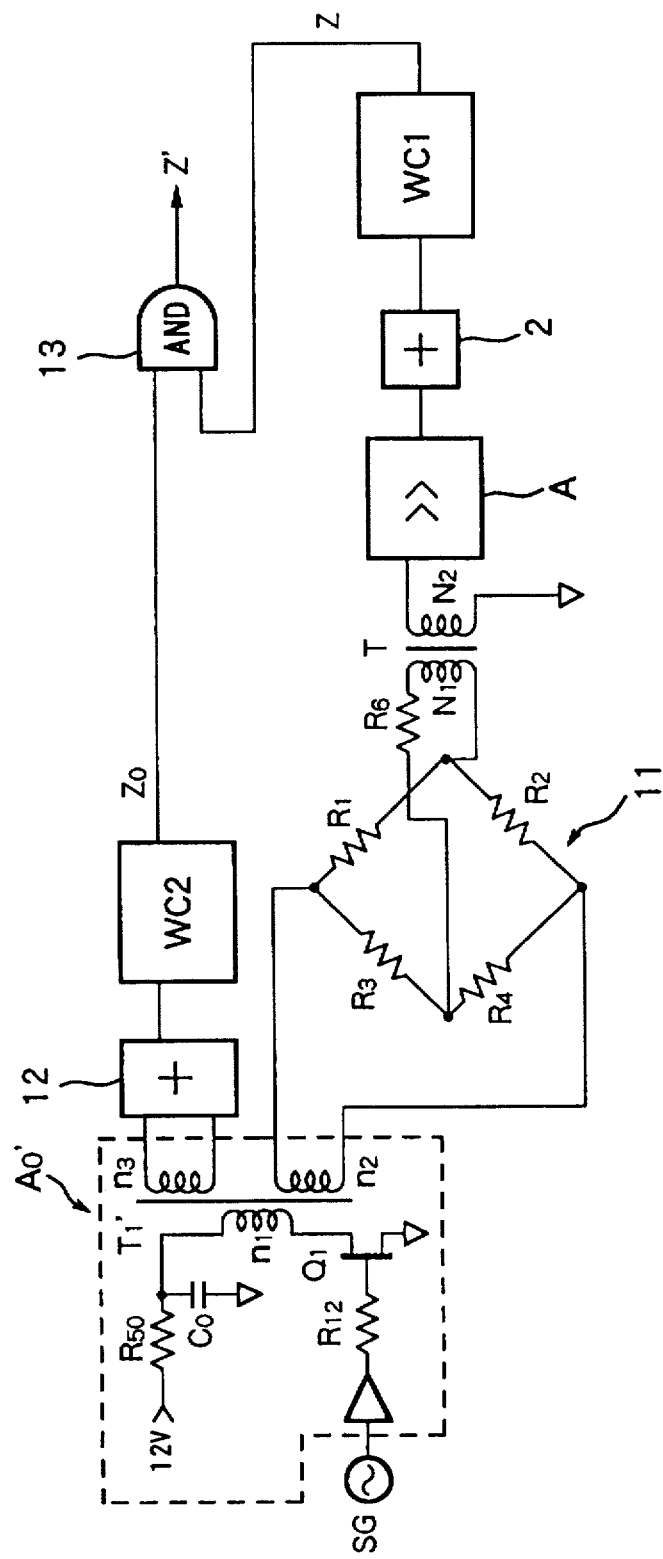
FIG. 9 is a circuit diagram of a first embodiment of the present invention.

FIG. 9 shows the construction of a first embodiment of a bridge circuit fault monitoring apparatus according to the present invention. Components similar to those of the circuit of FIG. 4 are indicated with the same symbols and description is omitted.

In FIG. 9, an amplifier $A_0'$ amplifies an alternating current signal from a signal generator SG and supplies this as an alternating current power source current to a bridge circuit 11 via a transformer $T_1'$. It has the same construction as the amplifier $A_0$ of FIG. 4, however as well as a primary winding $n_1$, and a secondary winding $n_2$ connected to the bridge circuit 11, the transformer $T_1'$ is provided with a third winding $n_3$ for monitoring a power source current $j_2$ of the bridge circuit 11. Here the power supply device is constituted by the signal generator SG and the amplifier $A_0'$.

With the bridge circuit 11, the four sides are made up completely by resistors $R_1$–$R_4$. An imbalance output signal of the bridge circuit 11 is supplied to the primary side of a transformer T via a resistor RG. The secondary side output of the transformer T is input to an amplifier A and amplified, then rectified by a rectifying circuit 2 and level detected by a first window comparator WC1. The first window comparator WC1 has previously set upper limit and lower limit threshold values $V_H$, $V_L$, generating an output of logic value "1" when the rectified output signal e from the rectifying circuit 2 is within the upper limit and lower limit threshold values, with a fail-safe construction which gives an output of logic value "0" at the time of a fault. As with the window comparator WC shown in FIG. 1, it comprises a plurality of resistors and a plurality of transistors, being a known device such as that in the beforementioned U.S. Pat. No. 4,661,880. Here the first window comparator WC1 corresponds to the first judgment device.

The alternating current output from the third winding $n_3$ of the transformer $T_1'$ is rectified by a rectifying circuit 12. The rectifying circuit 12 has the same construction as the rectifying circuit 2, and is constructed as shown in FIG. 4. A second window comparator WC2 detects the level of the rectified output voltage $V_S$ from the rectifying circuit 12, and has previously set upper limit and lower limit threshold values $V_H'$, $V_L'$, generating an output of logic value "1" when the rectified output voltage $V_S$ from the rectifying circuit 12 is within the upper limit and lower limit threshold values, with a fail-safe construction which gives an output of logic value "0" at the time of a fault. It has the same fail-safe construction as the first window comparator WC1. Here the second judgment device comprises the third winding $n_3$ of the transformer $T_1'$, the rectifying circuit 12 and the second window comparator WC2. The third winding $n_3$, with the present embodiment, corresponds to the power source current detection device.

Logical output signals Z, $Z_0$ from the respective first and second window comparators WC1, WC2 are input to an AND gate 13 which serves as a fail-safe logical product operating device. The AND gate 13 gives an output of logic value "1" when the logical output signals Z, $Z_0$ are both logic value "1", with a fail-safe construction which gives an output of logical value "0" at the time of a fault, being a known device such as that in U.S. Pat. No. 4,661,880.

Next is a description of the operation of the circuit of FIG. 9.

With the transformer $T_1'$ with for example the primary side (winding $n_1$ side) of 100 Ω, the secondary side (winding $n_2$ side) of 1 KΩ, and the tertiary side (winding $n_3$ side) of 2 KΩ, then if the frequency used (output frequency of the signal generator SG) is 5 KHz, 30 $V_{p-p}$ is produced in the secondary winding $n_2$ of the transformer $T_1'$, and 40 V direct current is generated for the output $V_S$ from the rectifying circuit 12 of the third winding $n_3$ of the transformer $T_1'$. Provided that the resistors $R_1$–$R_4$ on the four sides of the bridge circuit 11 are 1 KΩ, the output side resistor $R_6$ of the bridge circuit 11 is 3 KΩ, while the input resistance of the transformer T is approximately 1 KΩ.

Table 3 shows the size of the rectified output voltage $V_S$ generated in the third winding $n_3$ for this case, when the resistors $R_1$18 $R_4$ on the four sides of the bridge circuit 11 have a disconnection fault. Percentage change is shown in brackets, with normal voltage being 40 V.

TABLE 3

Monitoring voltage at the time of a bridge circuit disconnection fault

| Fault condition | Bridge circuit monitoring voltage Vs (V) |
| --- | --- |
| Ri single fault | 52 (+30%) |
| R6 disconnection | 40 (±0%) |
| $R_1$, $R_2$ disconnection | 53 (+33%) |
| $R_1$, $R_3$ disconnection | 80 and above (non load condition) |
| $R_1$, $R_4$ disconnection | 68 (+71%) |

With a disconnection of a resistor, the power source current of the bridge circuit 11 drops. Therefore the impedance as seen from the secondary side (winding $n_2$ side) of the transformer $T_1'$ increases, so that the output voltage of the third winding $n_3$ rises. Consequently, as is clear from Table 3, if the upper limit threshold value $V_H'$ of the second window comparator WC2 is set for example to 43 V, and the lower limit threshold value $V_L'$ is set to lower than 40 V, then with a fault other than a disconnection fault of the resistor $R_6$, $V_S$ becomes higher than 43 V. The logical output signal of the second window comparator WC2 thus becomes $Z_0=0$, and the logical output signal Z' of the AND gate 13 becomes logic value "0" indicating a fault in the bridge circuit. Hence fault detection of the bridge circuit 11 is possible.

With a disconnection fault of the resistor $R_6$, then $V_S=40$ V as when the bridge circuit 11 is normal, being within the upper and lower limit threshold values. Hence the output signal of the second window comparator WC2 becomes $Z_0=1$. However, with a disconnection fault of the resistor $R_6$ or a disconnection fault in the primary winding N1 of the transformer T, then the input signal level to the amplifier A becomes zero. Hence if the amplifier A is normal, and of course with a fault condition, the output signal of the first window comparator WC1 becomes Z=0. Therefore the logical output signal Z' of the AND gate 13 becomes a logic value "0" indicating a fault in the bridge circuit. Hence fault detection of the bridge circuit 11 is possible.

That is to say, the AND gate 13 only generates the output signal Z'=1 indicating normal conditions of the bridge circuit 11 at the time of the output signal Z=1 from the first window comparator WC1 and the output signal $Z_0=1$ from the second window comparator WC2, while when there is a fault in the bridge circuit 11 it generates an output signal Z'=0. Therefore a fault of the bridge circuit 11 can be reliably detected by using the output signal Z' of the AND gate 13.

With the first embodiment, description has been given for the case where the four sides of the bridge circuit are resistors. However, a thermistor (temperature detector), a magnetic reluctance element (magnetic detector), a CDS (optical detector), a sintered body (gas detector), or a strain gage (strain detector) and the like can be connected to one side of the bridge circuit as the transducer.

Figure 1:
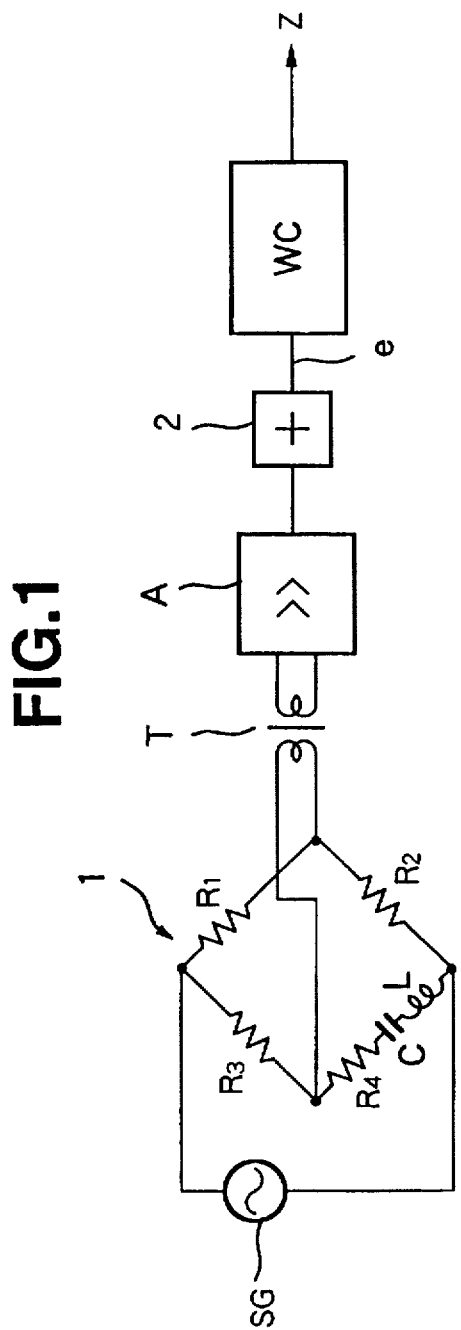
FIG. 1 is a circuit diagram of a conventional electromagnetic inductance sensor incorporating a bridge circuit fault monitoring function.
Figure 2:
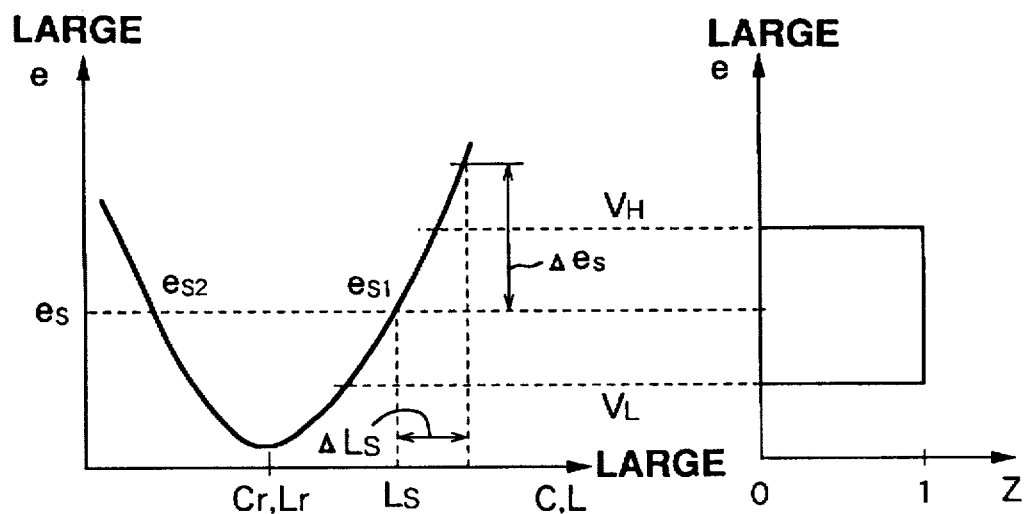
FIG. 2 is a diagram for explaining the operating theory of the electromagnetic inductance sensor of FIG. 1.

A description will now be given for the case wherein a resonance circuit of a coil L and a capacitor C is provided as shown in FIG. 1, on the side of the bridge circuit 11 of FIG. 9 provided with the resistor R4.

If for example, the inductance of the coil L is 10 mH (315 Ω, at 5 KHz), then if a short circuit fault occurs in the capacitor C, the series circuit of the resistor R4 and the coil L attains an impedance of the vector sum of 315Ω+1 KΩ. Therefore in the case where an LC resonance circuit is inserted in the resistor R4 side of FIG. 9, the output voltage $V_S$ of the rectifying circuit 12 can rise by 30% or more. If with the coil L, the conductors are separated by an insulting layer so that a short circuit fault will not occur, then the bridge circuit having the series resonance circuit such as shown in FIG. 1, is no different from the bridge circuit of FIG. 9 with the four sides made up of resistors only. Hence a fault in the bridge circuit can be reliably monitored, with a similar construction to that of FIG. 9.

Figure 10:
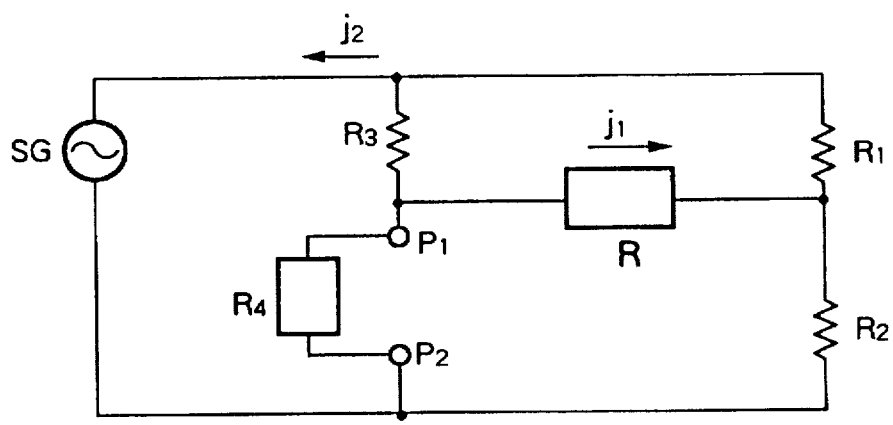
FIG. 10 is a diagram showing a basic structure of a bridge circuit for the case wherein a transducer is connected by means of external wiring terminals.

When in practice, the bridge circuit is used for a sensor, the transducer is connected to one side of the bridge circuit by external line terminals $P_1$, $P_2$. FIG. 10 shows such a basic circuit. The transducer is represented by resistor R4.

Figure 3:
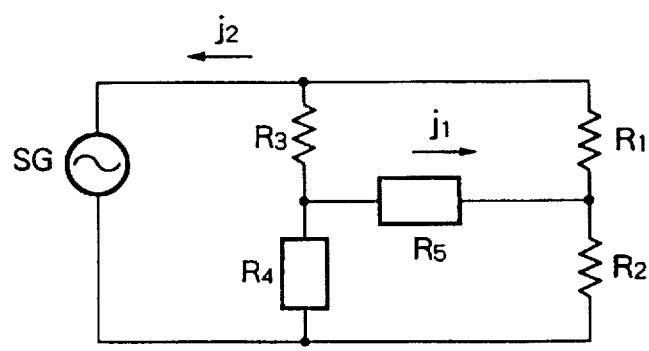
FIG. 3 is a diagram showing a basic construction of a bridge circuit.

In this case, assuming the situation wherein there is an accidental short circuit between the terminals $P_1$, $P_2$ (equivalent to a short circuit in the resistor R4), then the output current $j_1$ and the power source current $j_2$ for at the time of a bridge circuit fault become as shown by the results in Table 4. Provided that the resistance values of the resistors $R_1$–$R_4$ and the power source voltage $E_B$ of the bridge circuit are the same as for the case of FIG. 3, being 1 KΩ and 1 V.

TABLE 4

Output current and power source current at the time of a bridge circuit fault

| Fault condition | $j_1$ (mA) | $j_2$ (mA) |
| --- | --- | --- |
| $R_4$ short circuit | 0.33 | 1.67 |
| $R_1$ disconnection, $R_4$ short circuit | 0 | 1 |
| $R_3$ disconnection, $R_4$ short circuit | 0.33 | 0.67 |
| $R_2$ disconnection, $R_4$ short circuit | 0.5 | 1.5 |

From Table 4 it can be seen that there are positive changes in the change of power source current $j_2$ (increasing change in power source current), with the output current $j_1$ showing changes in the imbalance output current of 0.33 mA or more, and the power source current $j_2$ showing changes of +50% or more and −30% or less. However when terminals $P_1$, $P_2$ are short circuited, and the resistor $R_1$ is disconnected, then the output current $j_1$ does not flow and the power source current $j_2$ does not change.

Since there is a drop in the output voltage $V_S$ of the rectifying circuit 12 with a positive change in the power source current $j_2$, then the lower limit threshold value $V_L'$ of the second window comparator WC2 of FIG. 9 is set to detect this.

In the case of a short circuit of terminals $P_1$, $P_2$ and a disconnection fault in the resistor $R_1$, there is no change in the power source current $j_2$. However since the output current $j_1$ does not flow, the output signal of the first window comparator WC1 becomes Z=0, irrespective of the presence or absence of a fault in the amplifier A and the rectifying circuit 2. Therefore the logical output signal of the AND gate 13 becomes Z'=0. Hence the abovementioned fault detection is possible. With the rectifying circuit, the output characteristics are such that at the time of a fault, an output signal is not produced irrespective of there being no input signal.

Figure 11:
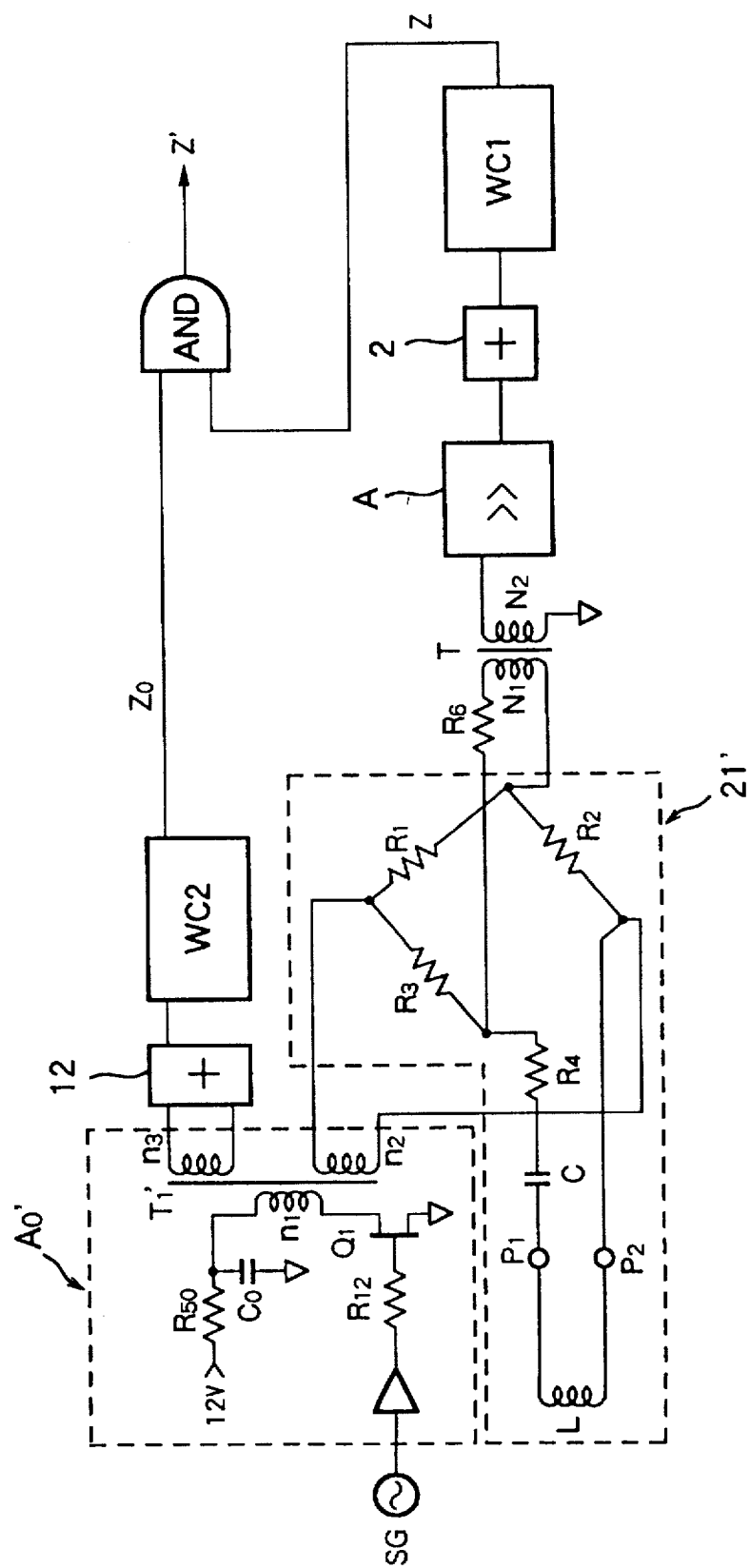
FIG. 11 is a circuit example which cannot monitor faults, in the case wherein a transducer is connected to external wiring terminals.

With an electromagnetic inductance sensor such as shown in FIG. 1 wherein an LC resonance circuit is provided on one side of the bridge circuit, then in the case of a bridge circuit 21' as shown in FIG. 11 with only a coil L connected to external line terminals $P_1$, $P_2$, then if the coil L and the capacitor C attain a resonance condition with resistors $R_1$–$R_3$=1 KΩ, and resistor $R_4$ is made approximately 1 KΩ, if there is a short circuit in the coil L (between terminals $P_1$, $P_2$), and also a short circuit fault occurs in the capacitor C, then with $R_1=R_2=R_3=1$ KΩ, $R_4$ becomes approximately equal to 1 KΩ. Hence there will be practically no change in the output current $j_1$ and the power source current $j_2$ of the bridge circuit. Consequently, with the construction of FIG. 11, the abovementioned fault cannot be detected.

Figure 12:
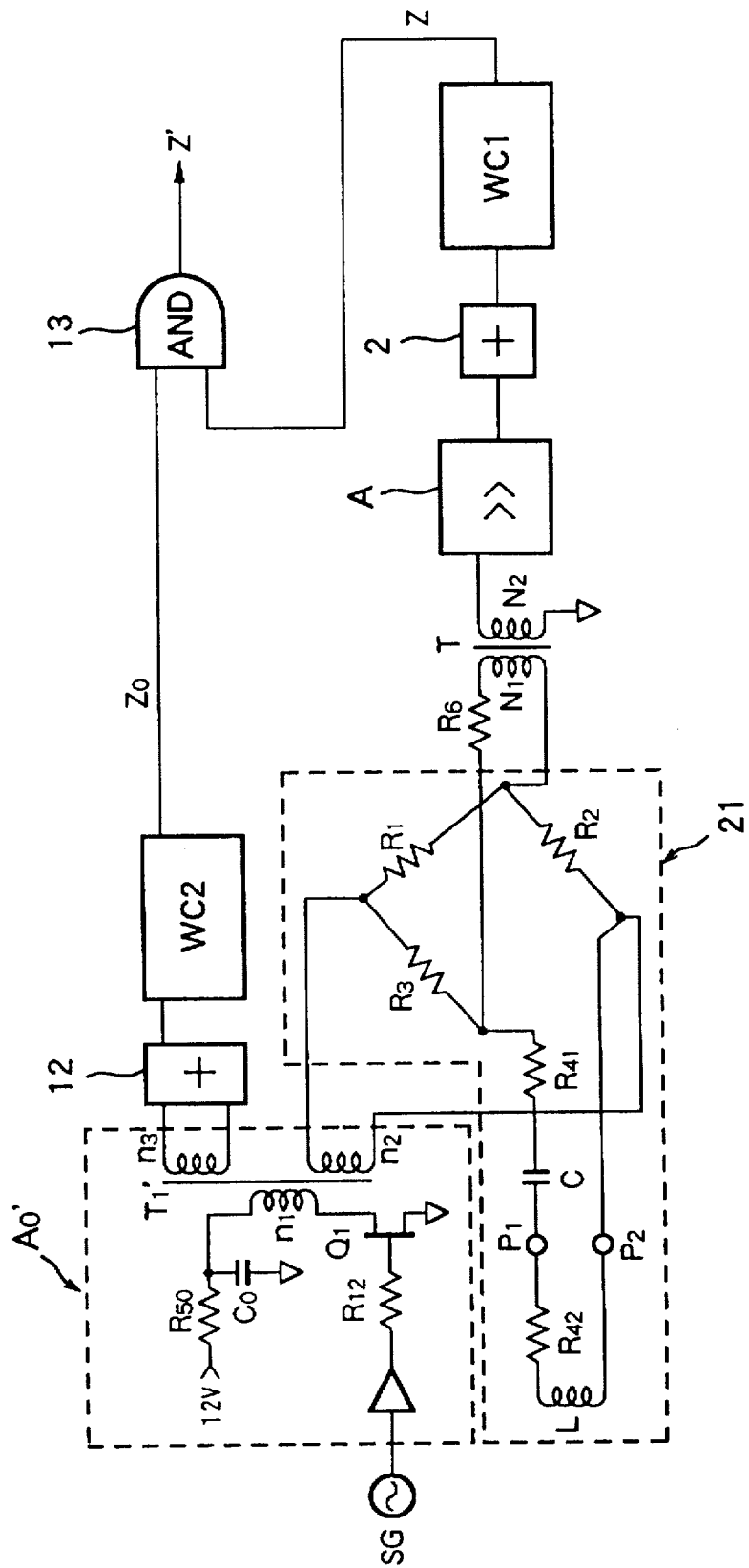
FIG. 12 is a circuit diagram of a second embodiment of the present invention applicable to the case wherein a transducer is connected to external wiring terminals.

FIG. 12 shows a circuit of a second embodiment of the present invention aimed at solving this problem. Components similar to those of the first embodiment of FIG. 9 are indicated with the same symbols and description is omitted.

In FIG. 12, a bridge circuit 21 is constructed with four sides; namely one side provided with a resonance circuit comprising resistors $R_{41}$, $R_{42}$, a coil L and a capacitor C, and the remaining sides constituted by respective resistors $R_1 \sim R_3$. The construction is such that with the one side on which the resonance circuit is provided the conventional resistor R4 is divided into two resistors $R_{41}$, $R_{42}$ with one resistors $R_{41}$ and the capacitor C connected in series to the bridge circuit side, and the other resistor $R_{42}$ and the coil L connected in series to the outer side by means of external line terminals P1, $P_2$.

With this circuit construction, in a worst case scenario with a short circuit fault between terminals $P_1$, $P_2$, then there is only resistor $R_{41}$, thus giving a drop in the resistance value compared to that before the short circuit. For example, in the case where $R_{41}=R_{42}$, if a short circuit fault occurs in the capacitor C, the resistance value drops by half. In this condition, the output current $j_1$ and the power source current $j_2$ of the bridge circuit 21 become as shown in Table 5. Here $R_{41}=R_{42}=50\ \Omega$.

TABLE 5

Output current and power source current at the time of a bridge circuit fault

| Fault condition | $j_1$ (mA) | $j_2$ (mA) |
| --- | --- | --- |
| $R_4$ (500Ω) | 0.09 | 1.18 |
| $R_1$ short circuit, $R_4$ (500Ω) | 0.14 | 0.71 |
| $R_3$ short circuit, $R_4$ (500Ω) | 0.25 | 0.63 |
| $R_2$ short circuit, $R_4$ (500Ω) | 0.29 | 0.88 |

As is apparent from Table 5, when the resistor R4 drops to 500 Ω, a change in power source current $j_2$ of −22% or less and +18% or more is obtained, with a change of 0.09 mA or more appearing in the output current $j_1$.

Consequently, if the upper limit and lower limit threshold values $V_H'$, $V_L'$ of the second window comparator WC2 are appropriately set, then the above changes in the power source current $j_2$ can be monitored, so that detection of the faults in the bridge circuit 21 such as described above is possible.

Figure 13:
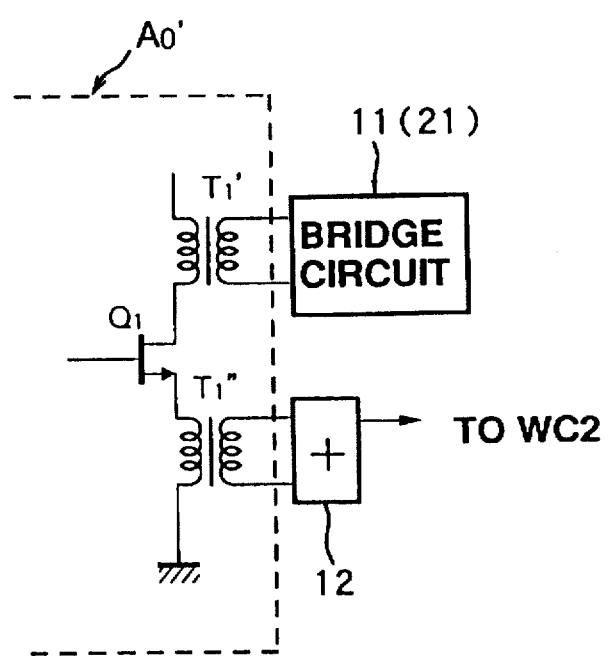
FIG. 13 is a circuit diagram showing the main parts of a third embodiment of the present invention.

With the first and second embodiments, the construction is such that a third winding $n_3$ is provided in the transformer T1' of the amplifier $A_0'$, for monitoring the power source current $j_2$ of the bridge circuit. However the construction may be such that a transformer T1" is provided separate from the transformer T1' as with a third embodiment shown in FIG. 13, for monitoring the power source current $j_2$.

Moreover, the amplifier for amplifying the imbalance output signal of the bridge circuit need not necessarily be one wherein the gain drops at the time of a fault, and if an operational amplifier is used, provided there is a device for carrying out low pass filtering on the output side of the operational amplifier, then generation of an output voltage due to self oscillation (normally at high frequency) can be prevented.

With the bridge circuit fault monitoring apparatus of the present invention as described above, by carrying out bridge circuit fault detection by monitoring the change in the bridge circuit power source current (which does not require amplification) input to the bridge circuit, then even if a multiple fault occurs with simultaneous faults in the bridge circuit and in the amplifier for amplifying the imbalance output signal of the bridge circuit, then a fault of the bridge circuit can be reliably detected. Moreover, in the case of a fault in the monitoring circuit, since an output the same at that of the fault detection signal is produced, then there is fail-safety.

INDUSTRIAL APPLICABILITY

The present invention can reliably detect a fault in the bridge circuit even in the case of multiple faults occurring in a sensor circuit using the bridge circuit. It is thus particularly effective in the fault monitoring of various sensor circuits used in a large number of measuring systems, and hence has considerable industrial applicability.

What is claimed is:

1. A bridge circuit fault monitoring apparatus for monitoring faults in a bridge circuit of a sensor circuit, comprising:

a bridge circuit for sampling a change in a detection object as a change in an imbalance output signal;

a power supply means for supplying an alternating current power source current to said bridge circuit;

an amplifier for amplifying the imbalance output signal from said bridge circuit, a fail-safe first judgment means for judging whether the amplified output signal level of said amplifier is normal and for generating an output of logic value "1" when normal, an output of logic value "0" when not normal, and an output of logic "0" at the time of a fault;

a fail-safe second judgment means for judging whether the power source; current level supplied to said bridge circuit is normal and for generating an output of logic value "1" when normal, an output of logic value "0" when not normal, and an output of logic value "0" at the time of a fault; and a fail-safe logical product operating means which generates an output of logic value "1" indicating that the bridge circuit is normal when the outputs from said first judgment means and said second judgment means are both of logic value "1", and which gives an output of logic value "0" at the time of a fault.

2. A bridge circuit fault monitoring apparatus according to claim 1, wherein said amplifier is constructed such that the gain drops at the time of a fault.

3. A bridge circuit fault monitoring apparatus according to claim 1, wherein said power supply means comprises; a signal generator for generating an alternating current signal, and an amplifier which amplifies the alternating current signal from said signal generator and supplies an alternating current power source current to said bridge circuit via a transformer.

4. A bridge circuit fault monitoring apparatus according to claim 1, wherein said first judgment means is a fail-safe first window comparator having an upper limit threshold value and a lower limit threshold value, which generates an output of logic value "1" when the amplified output signal level of said amplifier is within a range of the upper and lower limit threshold values, and which generates an output of logic value "0" when outside of the range of the upper limit and lower limit threshold values, and which gives an output of logic value "0" at the time of a fault.

5. A bridge circuit fault monitoring apparatus according to claim 1, wherein said second judgment means comprises;

power source current detection means for detecting an alternating current power source current supplied from said power supply means to said bridge circuit, a rectifying circuit for rectifying an alternating current output signal corresponding to the power source current output from said power source current detection means, and a fail-safe second window comparator having an upper limit threshold value and a lower limit threshold value, which respectively generates an output of logic value "1" when the rectified output signal level of said rectifying circuit is within a range of the upper and lower limit threshold values, and an output of logic value "0" when outside of the range of the upper limit and lower limit threshold values, and which gives an output of logic value "0" at the time of a fault.

6. A bridge circuit fault monitoring apparatus according to claim 5, wherein said power source current detection means is provided with a winding for detecting the power source current in a transformer in the amplifier of said power supply means.

7. A bridge circuit fault monitoring apparatus according to claim 1, wherein in the case wherein said bridge circuit is provided on one side with; an electromagnetic inductance coil serving as a transducer for converting a change in the detection object into an electrical signal, and a capacitor and a resistor constituting a resonance circuit with said electromagnetic inductance coil, and said electromagnetic inductance coil is connected to said one side via an external wiring terminal, then said resistor is divided in two with said external wiring terminal therebetween.

* * * * *